(12) United States Patent
Tomizawa et al.

(10) Patent No.: US 10,553,758 B2
(45) Date of Patent: Feb. 4, 2020

(54) SEMICONDUCTOR LIGHT EMITTING DEVICE

(71) Applicant: ALPAD Corporation, Chiyoda-ku (JP)

(72) Inventors: Hideyuki Tomizawa, Ota (JP); Akihiro Kojima, Nonoichi (JP); Miyoko Shimada, Hakusan (JP); Yosuke Akimoto, Nonoichi (JP); Hideto Furuyama, Yokohama (JP); Yoshiaki Sugizaki, Fujisawa (JP)

(73) Assignee: ALPAD Corporation, Chiyoda-ku (JP)

( * ) Notice: Subject to any disclaimer, the term of this patent is extended or adjusted under 35 U.S.C. 154(b) by 0 days.

(21) Appl. No.: 16/082,860

(22) PCT Filed: Mar. 8, 2017

(86) PCT No.: PCT/JP2017/009216
§ 371 (c)(1),
(2) Date: Sep. 6, 2018

(87) PCT Pub. No.: WO2017/154975
PCT Pub. Date: Sep. 14, 2017

(65) Prior Publication Data
US 2019/0097085 A1 Mar. 28, 2019

(30) Foreign Application Priority Data
Mar. 8, 2016 (JP) ................. 2016-044411

(51) Int. Cl.
*H01L 33/38* (2010.01)
*H01L 33/62* (2010.01)
(Continued)

(52) U.S. Cl.
CPC .......... *H01L 33/38* (2013.01); *H01L 33/405* (2013.01); *H01L 33/44* (2013.01); *H01L 33/62* (2013.01); *H01L 33/50* (2013.01); *H01L 33/60* (2013.01)

(58) Field of Classification Search
CPC .......... H01L 33/38; H01L 33/40; H01L 33/62
See application file for complete search history.

(56) References Cited

U.S. PATENT DOCUMENTS 9,837,580 B2 * 12/2017 Tomizawa ............ H01L 33/38
2011/0114986 A1 5/2011 Kojima et al.
(Continued)

FOREIGN PATENT DOCUMENTS

EP 2657999 A2 10/2013
EP 2701212 A1 2/2014
(Continued)

OTHER PUBLICATIONS

International Search Report dated May 9, 2017, in PCT/JP2017/009216 filed Mar. 8, 2017.

*Primary Examiner* — Dung A. Le
(74) *Attorney, Agent, or Firm* — Oblon, McClelland, Maier & Neustadt, L.L.P.

(57) ABSTRACT

The semiconductor layer has a first surface, a second surface provided on opposite side from the first surface, and a third surface provided on the opposite side from the first surface with a step difference with respect to the second surface. The semiconductor layer includes a light emitting layer between the first surface and the third surface. The first electrode is in contact with the second surface. The second electrode is provided in a plane of the third surface. The second electrode includes a contact part in contact with the third surface and an end part not in contact with the third surface. The second electrode contains silver. The insulating film is provided between the end part of the second electrode and the third (Continued)

surface. A semiconductor light emitting device having a high light extraction efficiency is provided.

10 Claims, 12 Drawing Sheets

(51) Int. Cl.
  *H01L 33/44*    (2010.01)
  *H01L 33/40*    (2010.01)
  H01L 33/50      (2010.01)
  H01L 33/60      (2010.01)

(56) References Cited

U.S. PATENT DOCUMENTS

| | | | |
|---|---|---|---|
| 2011/0297997 A1* | 12/2011 | Izuka | ...................... H01L 33/38 |
| | | | 257/99 |
| 2013/0146909 A1 | 6/2013 | Kojima et al. | |
| 2015/0280089 A1 | 10/2015 | Obata et al. | |
| 2016/0372631 A1 | 12/2016 | Hasegawa et al. | |

FOREIGN PATENT DOCUMENTS

| | | |
|---|---|---|
| JP | 2012-142639 A | 7/2012 |
| JP | 2013-123008 A | 6/2013 |
| JP | 5414579 B2 | 2/2014 |
| JP | 2015-195332 A | 11/2015 |
| WO | WO 2015/146069 A1 | 10/2015 |

* cited by examiner

SEMICONDUCTOR LIGHT EMITTING DEVICE

TECHNICAL FIELD

Embodiments relate to a semiconductor light emitting device.

BACKGROUND ART

A semiconductor light emitting device having a structure in which a p-side electrode and an n-side electrode are formed on one surface side of a semiconductor layer including a light emitting layer is known. In this semiconductor light emitting device, a light of the light emitting layer can be reflected by the electrode and extracted from the other surface side. In this case, it is desired that the electrode having a high light reflectance be spread with a large area on the one surface side.

PRIOR ART DOCUMENTS

Patent Documents

[Patent Document 1] Japanese Patent No. 5414579

SUMMARY

Technical Problem

Embodiments provide a semiconductor light emitting device having a high light extraction efficiency.

Solution to Problem

According to an embodiment, the semiconductor light emitting device includes a semiconductor layer, a first electrode, a second electrode, an insulating film, a first interconnect part, and a second interconnect part. The semiconductor layer has a first surface, a second surface provided on opposite side from the first surface, and a third surface provided on the opposite side from the first surface with a step difference with respect to the second surface. The semiconductor layer includes a light emitting layer between the first surface and the third surface. The first electrode is in contact with the second surface. The second electrode is provided in a plane of the third surface. The second electrode includes a contact part in contact with the third surface and an end part not in contact with the third surface. The second electrode contains silver. The insulating film is provided between the end part of the second electrode and the third surface. The first interconnect part is connected to the first electrode. The second interconnect part is connected to the second electrode.

DETAILED DESCRIPTION

Embodiments of the invention will now be described with reference to the drawings. In the drawings, the same elements are marked with the same numerals.

Figure 1A:
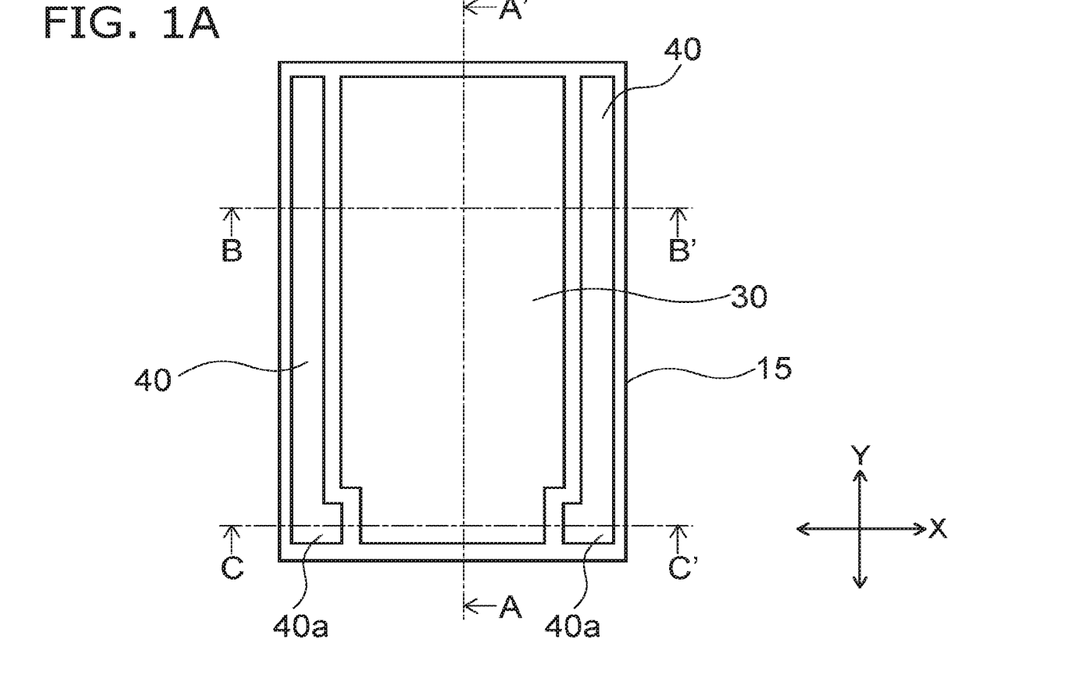
FIGS. 1A and 1B are schematic plan views of some components of a semiconductor light emitting device according to an embodiment.
Figure 1B:
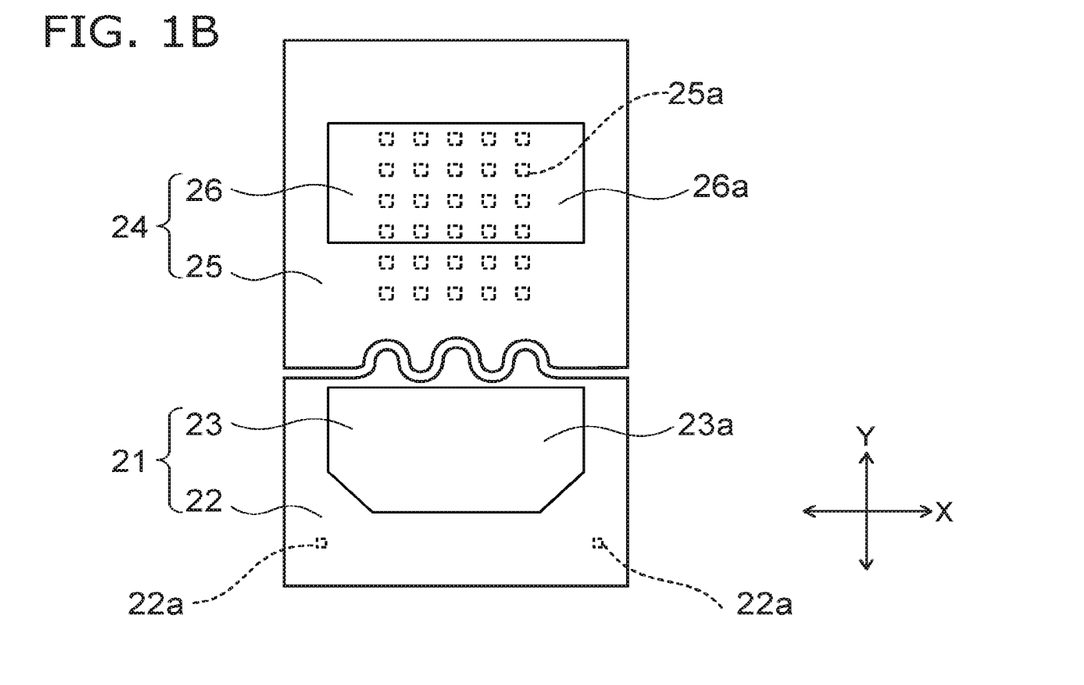

FIGS. 1A and 1B are schematic plan views of some components of a semiconductor light emitting device according to an embodiment. In FIGS. 1A and 1B, mutually orthogonal directions are referred to as X-direction and Y-direction.

Figure 2:
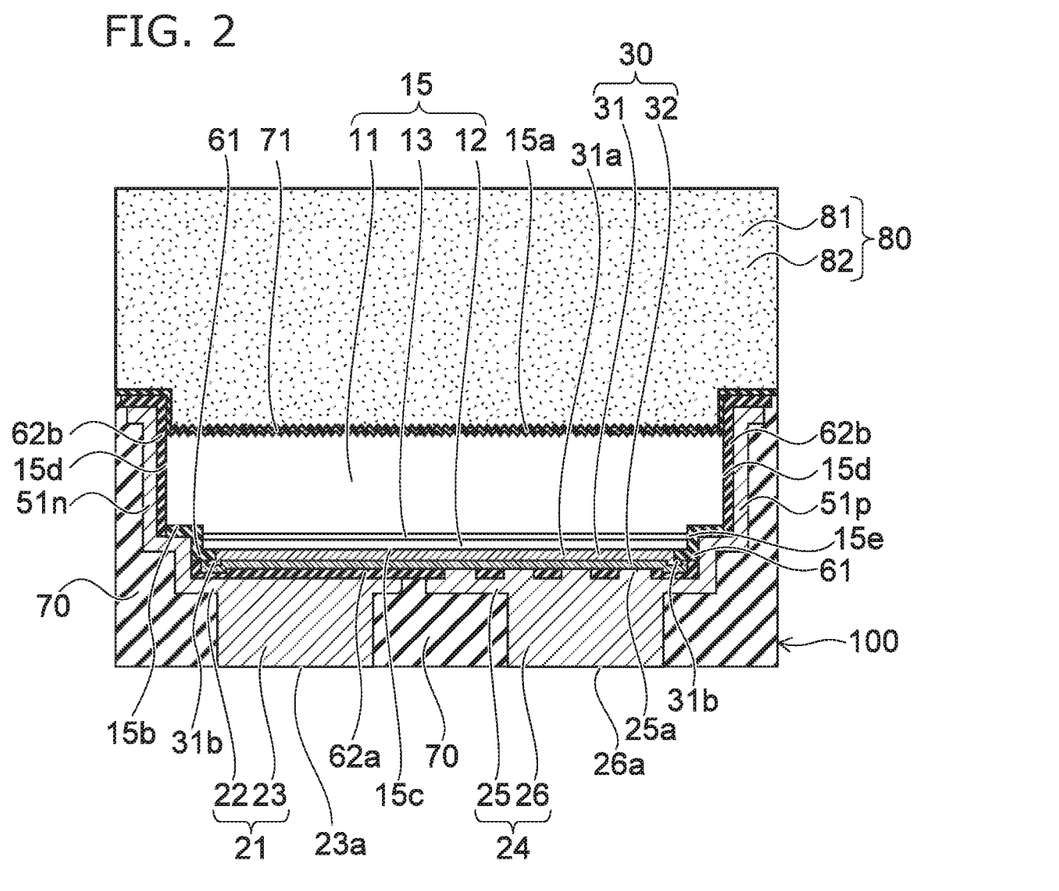
FIG. 2 is a sectional view corresponding to the A-A' cross section in FIG. 1A.

FIG. 2 is a sectional view corresponding to the A-A' cross section in FIG. 1A.

Figure 3A:
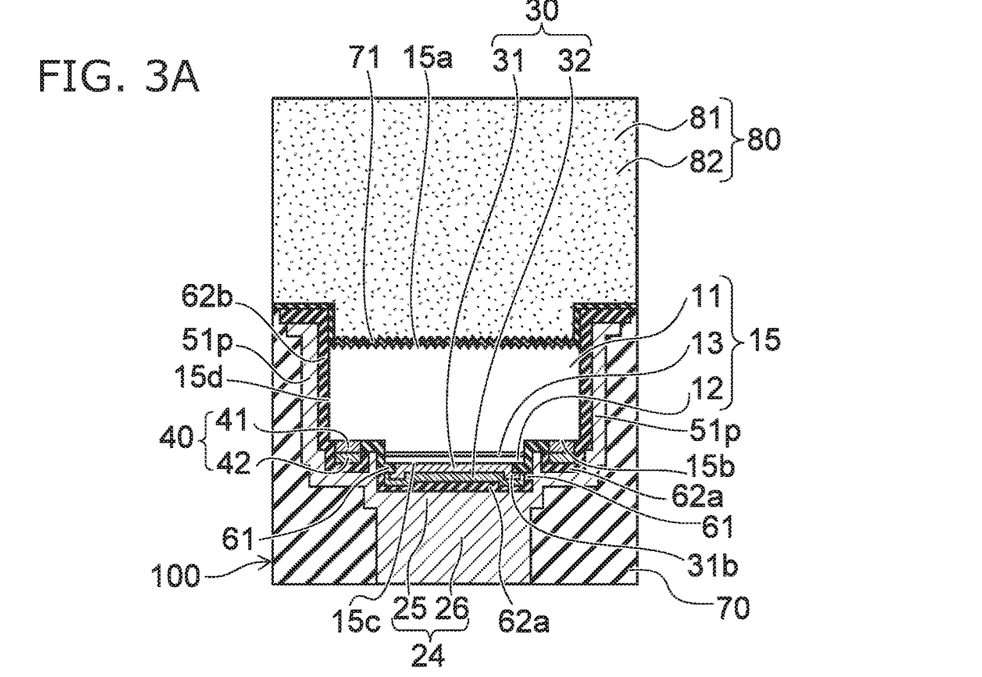
FIG. 3A is a sectional view corresponding to the B-B' cross section in FIG. 1A.

FIG. 3A is a sectional view corresponding to the B-B' cross section in FIG. 1A.

Figure 3B:
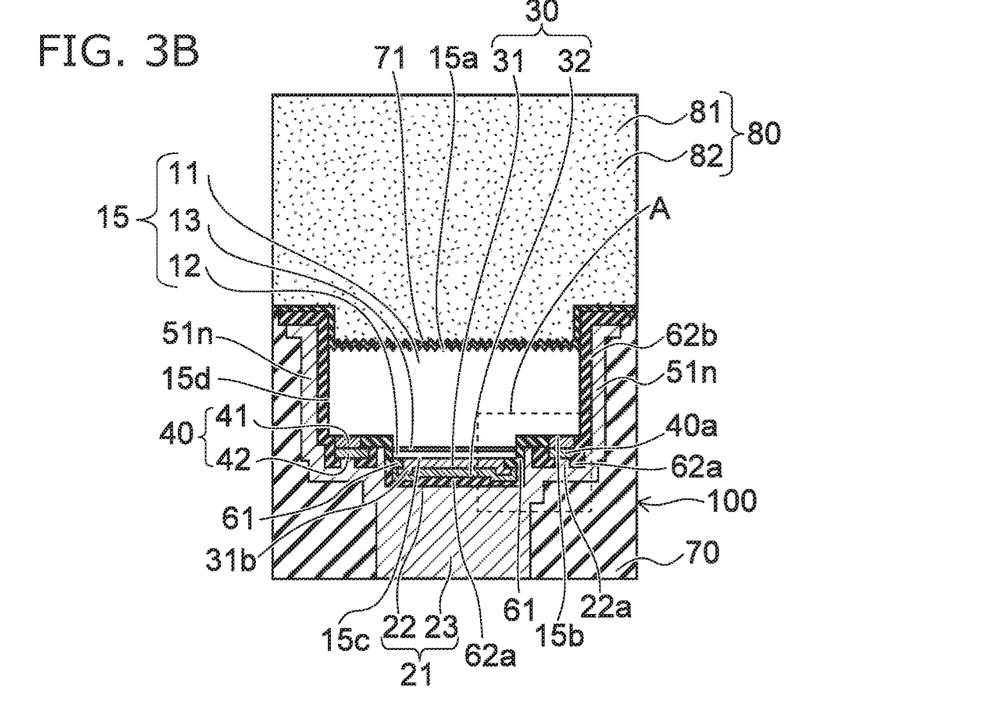
FIG. 3B is a sectional view corresponding to the C-C' cross section in FIG. 1A.

FIG. 3B is a sectional view corresponding to the C-C' cross section in FIG. 1A.

Figure 4:
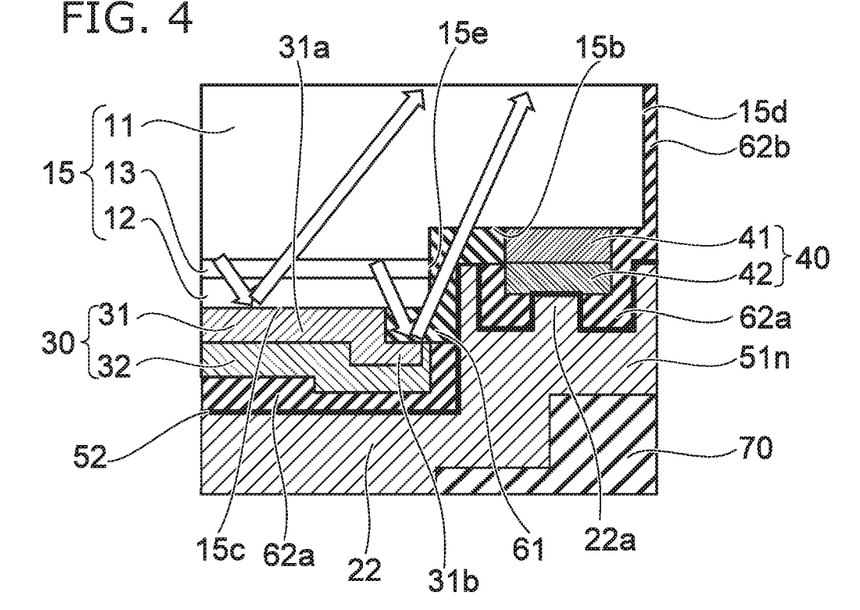
FIG. 4 is an enlarged sectional view of part A in FIG. 3B.

FIG. 4 is an enlarged sectional view of part A in FIG. 3B.

As shown in FIG. 2, the semiconductor light emitting device of the embodiment includes a support body 100, a phosphor layer 80, and a semiconductor layer 15 provided between the support body 100 and the phosphor layer 80.

The semiconductor layer 15 includes a first semiconductor layer 11, a second semiconductor layer 12, and a light emitting layer 13 provided between the first semiconductor layer 11 and the second semiconductor layer 12.

The semiconductor layer 15 contains e.g. gallium nitride. The first semiconductor layer 11 includes e.g. a foundation buffer layer and an n-type GaN layer. The second semiconductor layer 12 includes e.g. a p-type GaN layer.

The light emitting layer 13 has e.g. a multiple quantum well (MQW) structure. The emission peak wavelength of the light emitting layer 13 is e.g. 360 nm or more and 650 nm or less.

The first semiconductor layer 11 has a first surface 15a and a second surface 15b provided on the opposite side from the first surface 15a. The first surface 15a has a plurality of fine asperities. The opposite side of the first semiconductor layer 11 from the first surface 15a is processed into a shape having a protrusion and a depression. The second surface 15b is provided on the depression. The light emitting layer 13 and the second semiconductor layer 12 are provided on the protrusion. The light emitting layer 13 and the second semiconductor layer 12 are not provided on the depression of the first semiconductor layer 11.

The second semiconductor layer 12 has a third surface 15c provided on the opposite side from the first surface 15a with a step difference with respect to the second surface 15b of the first semiconductor layer 11. The light emitting layer 13 is provided between the first surface 15a and the third surface 15c.

An n-side electrode 40 is provided as a first electrode on the second surface 15b of the first semiconductor layer 11. A p-side electrode 30 is provided as a second electrode on the third surface 15c of the second semiconductor layer 12.

FIG. 1A shows an example of the planar layout of the n-side electrode 40 and the p-side electrode 30. For instance, two n-side electrodes 40 are arranged with the p-side electrode 30 interposed therebetween in the X-direction. The n-side electrode 40 is a line pattern extending in the Y-direction.

A contact part 40a is provided in one end part in the longitudinal direction (Y-direction) of the n-side electrode 40. The X-direction width of the contact part 40a is wider than the X-direction width of the linearly extending portion.

The third surface 15c is a region on which the light emitting layer 13 is stacked. The area of the third surface 15c is larger than the area of the second surface 15b on which the light emitting layer 13 is not stacked. The contact area of the p-side electrode 30 and the third surface 15c is larger than the contact area of the n-side electrode 40 and the second surface 15b.

A current is supplied to the light emitting layer 13 through the p-side electrode 30 and the n-side electrode 40, and the light emitting layer 13 emits light. The light emitted from the light emitting layer 13 is incident on the phosphor layer 80 from the first surface (rough surface) 15a side of the first semiconductor layer 11.

The phosphor layer 80 contains a plurality of particulate phosphors 81. The phosphor 81 is excited by the emission light of the light emitting layer 13 and emits light different in wavelength from the emission light. The plurality of phosphors 81 are dispersed in a transparent layer (binder layer) 82. The transparent layer 82 transmits the emission light of the light emitting layer 13 and the emission light of the phosphor 81. Here, the term "transmit" is not limited to a transmittance of 100%, but also includes the case of absorbing part of light.

As shown in FIGS. 3A, 3B, and 4, the n-side electrode 40 includes an aluminum (Al) film 41 and a pad electrode 42.

The aluminum film 41 is in contact with the second surface 15b of the first semiconductor layer 11. The aluminum film 41 functions as a contact electrode for reducing contact resistance with e.g. the second surface 15b containing e.g. n-type GaN. The aluminum film 41 functions also as a reflective film for reflecting the light emitted from the light emitting layer 13.

The pad electrode 42 covers the surface of the aluminum film 41 on the opposite side from the surface in contact with the second surface 15b. The pad electrode 42 contains e.g. at least one of titanium (Ti), platinum (Pt), gold (Au), and nickel (Ni).

The p-side electrode 30 includes a silver (Ag) film 31 and a pad electrode 32.

The silver film 31 functions as a contact electrode for reducing contact resistance with the third surface 15c containing e.g. p-type GaN. The silver film 31 functions also as a reflective film for reflecting the light emitted from the light emitting layer 13.

The pad electrode 32 covers the surface of the silver film 31 on the opposite side from the surface in contact with the third surface 15c. The pad electrode 32 covers the end surface of the silver film 31. The pad electrode 32 prevents diffusion of silver. The pad electrode 32 prevents sulfidation and oxidation of the silver film 31.

The pad electrode 32 contains e.g. at least one of titanium (Ti), platinum (Pt), gold (Au), and nickel (Ni).

The silver film 31 includes a contact part 31a in contact with the third surface 15c and an end part 31b. The end part 31b is provided along and near the contour line (edge) of the p-side electrode 30 shown in FIG. 1A.

The end part 31b of the silver film 31 is not in contact with the third surface 15c. An insulating film 61 is provided between the end part 31b and the third surface 15c. The end part 31b is provided so as to override the insulating film 61 and opposed to the third surface 15c across the insulating film 61.

The contact area of the contact part 31a of the silver film 31 and the third surface 15c is larger than the contact area of the insulating film 61 and the third surface 15c.

The p-side electrode 30 is provided in the plane of the third surface 15c. The p-side electrode 30 is not provided on the side surface 15e, the second surface 15b, and the side surface 15d of the semiconductor layer 15 shown in FIG. 4.

The end of the p-side electrode 30 may slightly extend out from the end of the third surface 15c due to process variation to the extent of not overlapping the side surface 15e. Such cases can also be included in the expression that the p-side electrode 30 is provided in the plane of the third surface 15c.

The side surface 15e is continuous with the third surface 15c and the second surface 15b. The side surface 15e is a side surface of the protruding portion of the semiconductor layer 15 including the staked part of the second semiconductor layer 12 and the light emitting layer 13.

The side surface 15d is a side surface of the first semiconductor layer 11 and continuous with the first surface 15a and the second surface 15b.

The insulating film 61 is provided on the side surface 15e. The insulating film 61 is provided also on the second surface 15b between the side surface 15e and the n-side electrode 40.

An insulating film 62b is provided on the side surface 15d. The p-side electrode 30 and the n-side electrode 40 are covered with an insulating film 62a.

The support body 100 is provided on the third surface 15c side of the semiconductor layer 15. The light emitting element including the semiconductor layer 15, the p-side electrode 30, and the n-side electrode 40 is supported by the support body 100.

The support body 100 includes an n-side interconnect part (first interconnect part) 21, a p-side interconnect part (second interconnect part) 24, and a resin layer (insulating layer) 70.

The n-side interconnect part 21 includes an n-side interconnect layer 22 and an n-side metal pillar 23. The p-side interconnect part 24 includes a p-side interconnect layer 25 and a p-side metal pillar 26.

FIG. 1B shows an example of the planar layout of the n-side interconnect layer 22, the n-side metal pillar 23, the p-side interconnect layer 25, and the p-side metal pillar 26.

The p-side interconnect layer 25 and the n-side interconnect layer 22 are provided on the insulating film 62a and spaced from each other in the Y-direction.

The p-side interconnect layer 25 is electrically connected to the p-side electrode 30 through a plurality of vias 25a penetrating through the insulating film 62a. The n-side interconnect layer 22 is electrically connected to the contact part 40a of the n-side electrode 40 through a via 22a penetrating through the insulating film 62a.

As shown in FIG. 2, a metal film 51p continuous with the p-side interconnect layer 25 and a metal film 51n continuous with the n-side interconnect layer 22 are provided on the lateral side of the semiconductor layer 15. The metal film 51p and the metal film 51n cover the side surface 15d of the semiconductor layer 15 via the insulating film 62b. The metal film 51p and the metal film 51n are separated in the Y-direction shown in FIG. 1B.

As shown in FIG. 3A, the metal film 51p is provided along the insulating film 61 between the p-side electrode 30 and the n-side electrode 40, the insulating film 62a covering the n-side electrode 40, and the insulating film 62b covering the side surface 15d.

As shown in FIGS. 3B and 4, the metal film 51n is provided along the insulating film 61 between the p-side electrode 30 and the n-side electrode 40, the insulating film 62a covering the n-side electrode 40, and the insulating film 62b covering the side surface 15d.

The p-side interconnect layer 25, the n-side interconnect layer 22, the metal film 51p, and the metal film 51n include e.g. a copper film. The p-side interconnect layer 25, the n-side interconnect layer 22, the metal film 51p, and the metal film 51n are simultaneously formed on a foundation metal film 52 shown in FIG. 4.

The foundation metal film 52 includes an aluminum film, a titanium film, and a copper film stacked sequentially from the insulating film 61, 62a, 62b side.

The p-side interconnect layer 25, the n-side interconnect layer 22, the metal film 51p, and the metal film 51n are deposited by plating on the copper film of the foundation metal film 52. The titanium film of the foundation metal film 52 is superior in wettability on both the aluminum film and the copper film and functions as an adhesion layer.

According to the embodiment, as shown in FIG. 4, the light emitted from the light emitting layer 13 toward the third surface 15c can be reflected by the silver film 31 and directed to the phosphor layer 80 side. The silver film 31 has a higher reflectance than titanium and aluminum for the light emitted by the light emitting layer 13, such as light having an emission peak wavelength of 360 nm or more and 650 nm or less. The silver film 31 having such a high reflectance is spread to the end of the third surface 15c to provide a reflection surface of silver having the same area as the third surface 15c. This improves the efficiency of light extraction from the phosphor layer 80 side.

The n-side electrode 40 includes an aluminum film 41, and the foundation metal film 52 also includes an aluminum film. Aluminum has a higher reflectance than titanium and copper for e.g. light having an emission peak wavelength of 360 nm or more and 650 nm or less.

Thus, the light traveling out of the side surface 15e, the second surface 15b, and the side surface 15d of the semiconductor layer 15 can be reflected by the aluminum film and directed to the phosphor layer 80 side. This also improves the efficiency of light extraction from the phosphor layer 80 side.

In general, the current tends to concentrate near the end of the p-side electrode having a close distance to the n-side electrode. The bias in the current distribution leads to the bias in the emission intensity distribution. This may lead to the decrease of efficiency, heat dissipation, and lifetime.

In contrast, according to the embodiment, the insulating film 61 is provided between the end part 31b of the silver film 31 of the p-side electrode 30 and the third surface 15c.

The p-side electrode 30 is not in contact with the third surface 15c. Between the end part 31b and the semiconductor layer 15, the current does not flow directly in the stacking direction of the p-side electrode 30 and the semiconductor layer 15.

This can relax the current concentration near the end of the p-side electrode 30. Thus, the emission intensity distribution can be made uniform. This improves the light emission efficiency and reliability.

As shown in FIG. 2, the p-side interconnect layer 25 is provided with a p-side metal pillar 26, and the n-side interconnect layer 22 is provided with an n-side metal pillar 23.

The resin layer 70 is provided as an insulating layer between the p-side interconnect part 24 including the p-side interconnect layer 25 and the p-side metal pillar 26, and the n-side interconnect part 21 including the n-side interconnect layer 22 and the n-side metal pillar 23. The resin layer 70 is provided on the side surface of the p-side interconnect part 24 and the side surface of the n-side interconnect part 21.

The resin layer 70 is provided between the p-side metal pillar 26 and the n-side metal pillar 23 so as to be in contact with the side surface of the p-side metal pillar 26 and the side surface of the n-side metal pillar 23. The resin layer 70 is provided around the p-side metal pillar 26 and around the n-side metal pillar 23. The resin layer 70 covers the side surface of the p-side metal pillar 26 and the side surface of the n-side metal pillar 23. The resin layer 70 is provided between the p-side interconnect layer 25 and the n-side interconnect layer 22.

The resin layer 70 is provided also on the lateral side of the semiconductor layer 15 and covers the metal film 51n and the metal film 51p.

Part of the phosphor layer 80 is provided on the resin layer 70 on the lateral side of the semiconductor layer 15 via the insulating film 62b and an insulating film 71.

The end part (end surface) 26a of the p-side metal pillar 26 is exposed from the resin layer 70 and functions as a p-side external terminal 26a connectable to an external circuit such as a mounting substrate. The end part (end surface) 23a of the n-side metal pillar 23 is exposed from the resin layer 70 and functions as an n-side external terminal 23a connectable to an external circuit such as a mounting substrate. The p-side external terminal 26a and the n-side external terminal 23a are bonded to pads of the mounting substrate via e.g. solder.

As shown in FIG. 1B, the p-side external terminal 26a and the n-side external terminal 23a are juxtaposed and spaced from each other in the Y-direction. The p-side external terminal 26a is formed in e.g. a rectangular shape. The n-side external terminal 23a is formed in a rectangular shape of the same size as the rectangle of the p-side external terminal 26a except that two corners are chamfered. This enables polarity determination of the external terminal. Alternatively, the n-side external terminal 23a may be shaped like a rectangle, and the p-side external terminal 26a may be shaped like a rectangle with chamfered corners.

The spacing between the p-side external terminal 26a and the n-side external terminal 23a is wider than the spacing between the p-side interconnect layer 25 and the n-side interconnect layer 22. The spacing between the p-side external terminal 26a and the n-side external terminal 23a is made larger than the spread of solder at the time of mounting. This can prevent short circuit between the p-side external terminal 26a and the n-side external terminal 23a through solder.

In contrast, the spacing between the p-side interconnect layer 25 and the n-side interconnect layer 22 can be narrowed to the process limit. This can expand the area of the p-side interconnect layer 25, and the contact area of the p-side interconnect layer 25 and the p-side metal pillar 26. Thus, heat dissipation of the light emitting layer 13 can be facilitated through the p-side electrode 30, the p-side interconnect layer 25, and the p-side metal pillar 26.

The thickness of the p-side metal pillar 26 (the thickness in the direction connecting the p-side external terminal 26a and the semiconductor layer 15) is thicker than the thickness of the p-side interconnect layer 25. The thickness of the n-side metal pillar 23 (the thickness in the direction connecting the n-side external terminal 23a and the semiconductor layer 15) is thicker than the thickness of the n-side interconnect layer 22. Each thickness of the p-side metal pillar 26, the n-side metal pillar 23, and the resin layer 70 is thicker than the thickness of the semiconductor layer 15.

The thickness of the support body 100 including the p-side interconnect layer 25, the n-side interconnect layer 22, the p-side metal pillar 26, the n-side metal pillar 23, and the resin layer 70 is thicker than the thickness of the light emitting element (LED chip) including the semiconductor layer 15, the p-side electrode 30, and the n-side electrode 40.

The semiconductor layer 15 is formed by the epitaxial growth method on a substrate. The substrate is removed after the support body 100 is formed. The substrate is not left on the first surface 15a side of the semiconductor layer 15. The semiconductor layer 15 is supported not by a rigid plate-like substrate, but by the support body 100 made of a composite of the metal pillars 26, 23 and the resin layer 70.

The p-side interconnect part 24 and the n-side interconnect part 21 can be made of a material such as copper, gold, nickel, and silver. Among them, use of copper can achieve good thermal conductivity, high migration resistance, and good adhesiveness to insulating material.

The resin layer 70 reinforces the p-side metal pillar 26 and the n-side metal pillar 23. The resin layer 70 is preferably made of a material having a thermal expansion rate equal or close to that of the mounting substrate. Such a resin layer 70 can be made of e.g. a resin primarily containing epoxy resin, a resin primarily containing silicone resin, or a resin primarily containing fluororesin.

The base resin of the resin layer 70 contains e.g. a light-absorbing agent, a light-reflecting agent, or a light-scattering agent. Thus, the resin layer 70 has light blocking capability or reflectivity to light of the light emitting layer 13. Such a resin layer 70 suppresses light leakage from the side surface and the mounting surface side of the support body 100.

By the thermal cycle at the time of mounting of the semiconductor light emitting device, the semiconductor layer 15 is subjected to stress due to e.g. solder for bonding the p-side external terminal 26a and the n-side external terminal 23a to the pads of the mounting substrate. The p-side metal pillar 26, the n-side metal pillar 23, and the resin layer 70 absorb and relax the stress. In particular, the resin layer 70 softer than the semiconductor layer 15 is used as part of the support body 100. This can enhance the stress relaxation effect.

The removal of the substrate used to form (grow) the semiconductor layer 15 reduces the profile of the semiconductor light emitting device. Fine asperities can be formed at the first surface 15a of the semiconductor layer 15 from which the substrate has been removed. This can improve the light extraction efficiency. For instance, fine asperities are formed by wet etching with an alkali-based solution. Thus, a rough surface 15a is formed on the light extraction side of the semiconductor layer 15. The rough surface 15a reduces the total reflection component and improves the light extraction efficiency.

The phosphor layer 80 is formed on the first surface (rough surface) 15a via the insulating film 71. The insulating film 71 functions as an adhesion layer for enhancing the adhesiveness between the semiconductor layer 15 and the phosphor layer 80. The insulating film 71 is e.g. a silicon oxide film or silicon nitride film.

The insulating film 71 is formed conformally along the fine asperities of the first surface (rough surface) 15a. Fine asperities reflecting the fine asperities of the first surface (rough surface) 15a are formed also at the upper surface of the insulating film 71.

The phosphor layer 80 is not extended onto the lateral side of the semiconductor layer 15, the side surface of the support body 100, and the mounting surface side. The side surface of the phosphor layer 80 is aligned with the side surface of the support body 100 (the side surface of the resin layer 70). Such a semiconductor light emitting device of the embodiment is a semiconductor light emitting device of the chip-size package structure having a very small size.

Light is not extracted outside from the mounting surface side. The phosphor layer 80 is not formed uselessly on the mounting surface side. This can reduce the cost. Heat of the light emitting layer 13 can be dissipated to the mounting substrate side through the p-side interconnect layer 25, the n-side interconnect layer 22, and the thick metal pillars 26, 23 spread on the opposite side from the first surface 15a. Thus, the semiconductor light emitting device is superior in heat dissipation capability in spite of its small size.

In the typical flip-chip mounting, an LED chip is mounted on the mounting substrate via e.g. bumps. Then, a phosphor layer is formed so as to entirely cover the chip. Alternatively, resin is underfilled between the bumps.

In contrast, according to the embodiment, the resin layer 70 different in achieved functionality from the phosphor layer 80 is provided around the p-side metal pillar 26 and around the n-side metal pillar 23 before mounting. This can provide the mounting surface side with characteristics suitable for stress relaxation. Furthermore, the resin layer 70 already provided on the mounting surface side eliminates the need of underfilling after mounting.

An optical layer designed preferentially for light extraction efficiency, color conversion efficiency, and light distribution characteristics is provided on the first surface 15a side. A layer designed preferentially for stress relaxation at the time of mounting and characteristics for a support body replacing the substrate is provided on the mounting surface side. For instance, the resin layer 70 can be filled with filler such as silica particles at high density. Thus, the hardness of the resin layer 70 can be adjusted to a level suitable for a support body.

Light emitted from the light emitting layer 13 to the first surface 15a side is incident on the phosphor layer 80. Part of the light excites the phosphor 81. For instance, white light is artificially obtained as mixed light of the light of the light emitting layer 13 and the light of the phosphor 81.

Here, if a substrate exists on the first surface 15a, part of the light fails to be incident on the phosphor layer 80 and leaks outside from the side surface of the substrate. That is, light of a strong color of the light emitting layer 13 leaks from the side surface of the substrate. This may cause color breakup or color unevenness such as a phenomenon in which a ring of blue light appears on the outer edge side of the phosphor layer 80 as viewed from above the upper surface.

In contrast, according to the embodiment, there is no substrate between the first surface 15a and the phosphor layer 80. This can prevent color breakup or color unevenness caused by leakage of light of a strong color of the light emitting layer 13 from the substrate side surface.

Next, a method for manufacturing the semiconductor light emitting device of the embodiment is described with reference to FIGS. 5A to 10.

The cross section shown in FIGS. 5A to 10 shows a cross section of a portion in the wafer state and corresponds to the cross section shown in FIG. 3A.

Figure 5A:
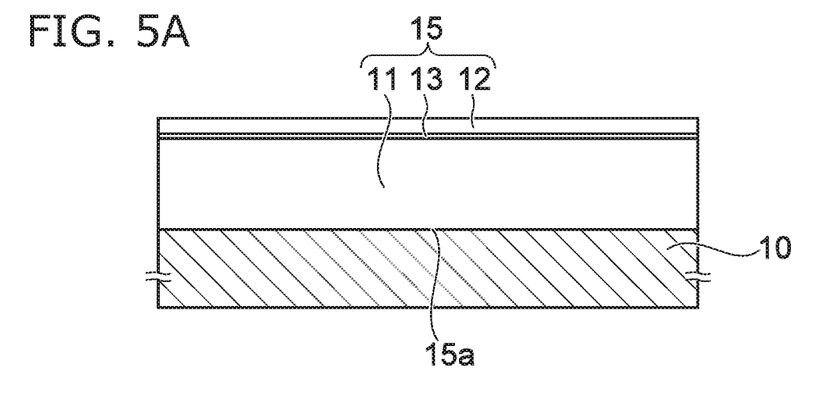
FIG. 5A to FIG. 5C are schematic sectional views showing a method for manufacturing the semiconductor light emitting device according to the embodiment.

As shown in FIG. 5A, a first semiconductor layer 11, a light emitting layer 13, and a second semiconductor layer 12 are sequentially epitaxially grown on a major surface of a substrate 10 by e.g. the metal organic chemical vapor deposition (MOCVD) method.

In the semiconductor layer 15 including the first semiconductor layer 11, the light emitting layer 13, and the second semiconductor layer 12, the first surface 15a is a surface on the substrate 10 side.

The substrate 10 is e.g. a silicon substrate. Alternatively, the substrate 10 may be a sapphire substrate. The semiconductor layer 15 is e.g. a nitride semiconductor layer containing gallium nitride (GaN).

Figure 5B:
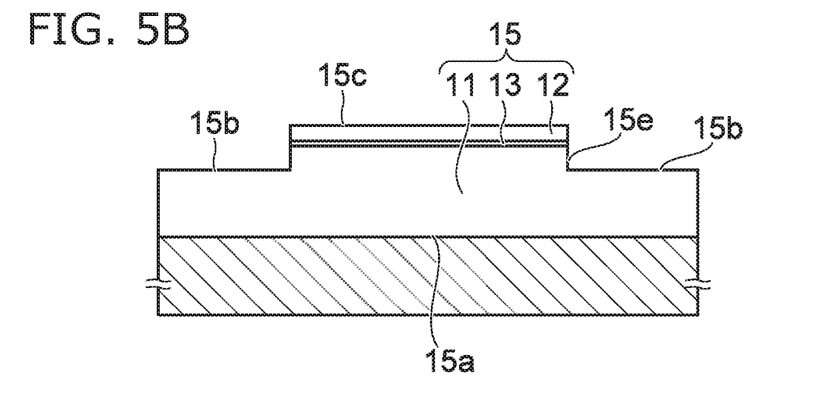

Part of the light emitting layer 13 and part of the second semiconductor layer 12 are removed as shown in FIG. 5B by e.g. the reactive ion etching (RIE) method.

The second surface 15b of the first semiconductor layer 11 is exposed at the portion from which the light emitting layer 13 and the second semiconductor layer 12 have been removed. The remaining portion shaped like a protrusion has an upper surface (third surface) 15c and a side surface 15e.

Figure 5C:
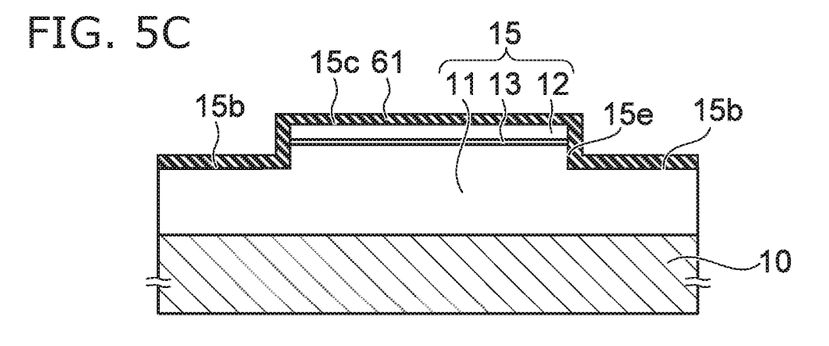

As shown in FIG. 5C, an insulating film 61 is formed on the second surface 15b, the third surface 15c, and the side surface 15e. The insulating film 61 is formed conformally along the second surface 15b, the third surface 15c, and the side surface 15e.

The insulating film 61 is formed from e.g. silicon oxide film or silicon nitride film by the chemical vapor deposition (CVD) method.

Figure 6A:
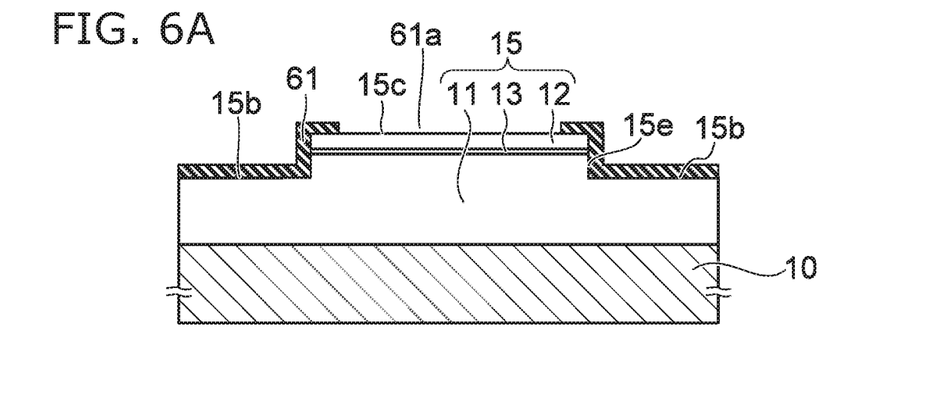
FIG. 6A to FIG. 6C are schematic sectional views showing a method for manufacturing the semiconductor light emitting device according to the embodiment.

Part of the insulating film 61 is removed by e.g. the wet etching method. Thus, as shown in FIG. 6A, an opening 61a is formed in the insulating film 61. The third surface 15c is exposed in the opening 61a.

The area of the opening 61a is smaller than the area of the third surface 15c. The third surface 15c is not exposed near its edge, but the insulating film 61 is left near the edge of the third surface 15c.

Figure 6B:
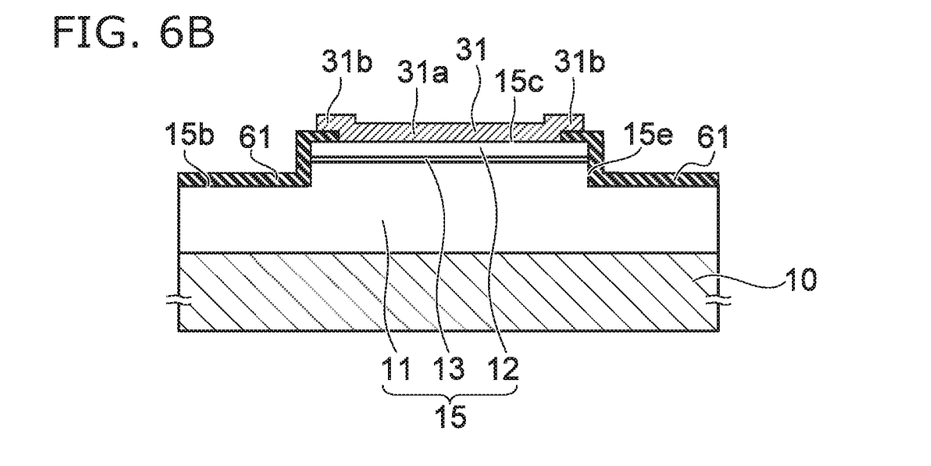

As shown in FIG. 6B, a silver film 31 of the p-side electrode is formed by e.g. the evaporation method on the third surface 15c exposed in the opening 61a. The end part 31b of the silver film 31 overrides the insulating film 61 left near the edge of the third surface 15c. The edge of the end part 31b is fitted in the plane of the third surface 15c.

Figure 6C:
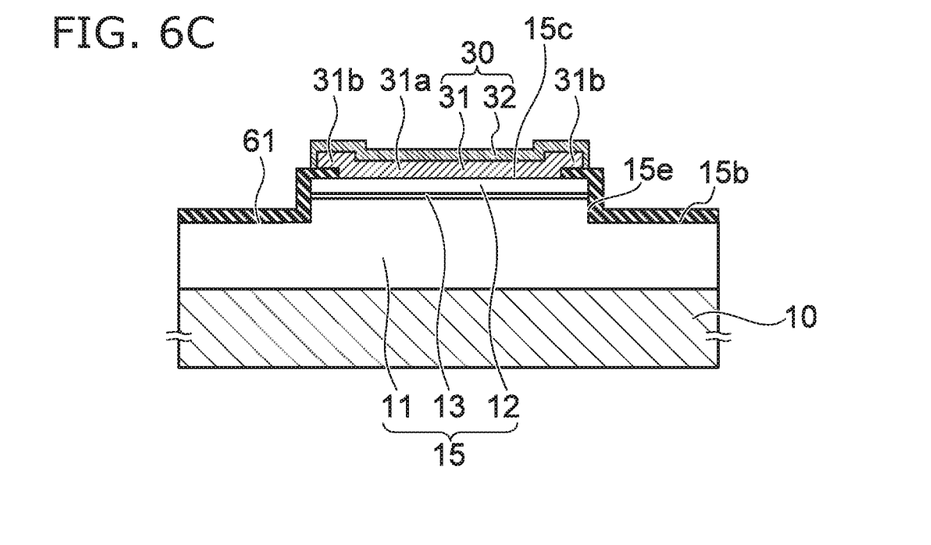

Next, as shown in FIG. 6C, a pad electrode 32 is formed by e.g. the evaporation method on the silver film 31. The pad electrode 32 covers the upper surface of the silver film 31 and the edge of the end part 31b. The edge of the pad electrode 32 is fitted in the plane of the third surface 15c.

Figure 7A:
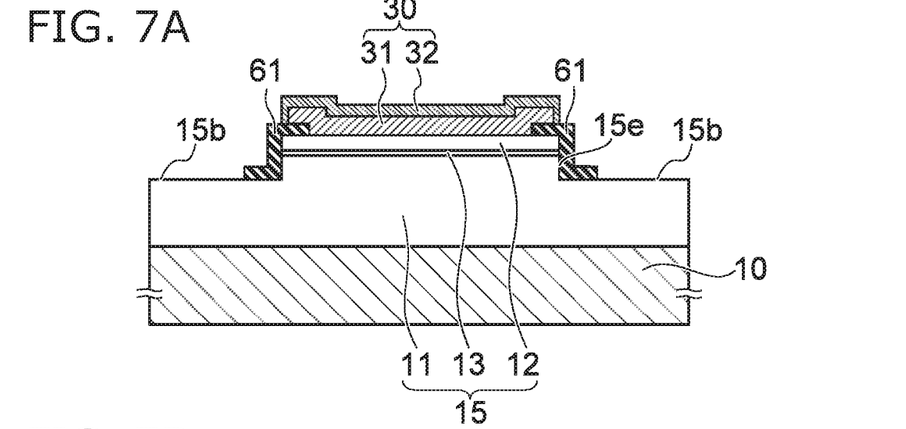
FIG. 7A to FIG. 7C are schematic sectional views showing a method for manufacturing the semiconductor light emitting device according to the embodiment.

Next, part of the insulating film 61 on the second surface 15b is removed by e.g. the wet etching method. Part of the second surface 15b is exposed as shown in FIG. 7A. The side surface 15e and the corner part of the side surface 15e and the second surface 15b are covered with the insulating film 61.

Figure 7B:
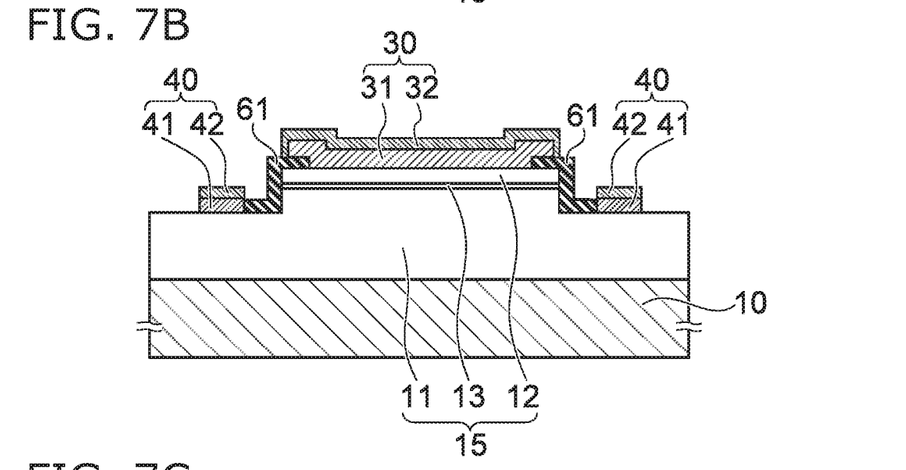
Figure 12:
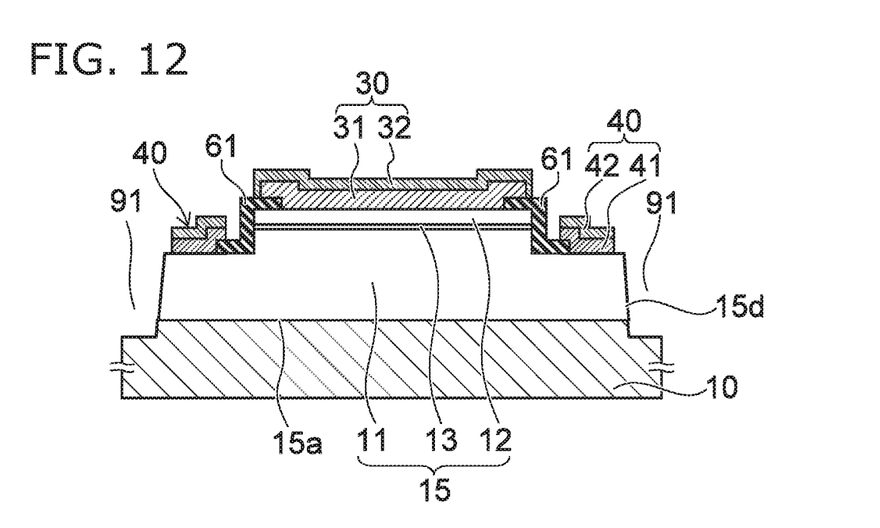
FIG. 12 is a schematic sectional view showing a method for manufacturing the semiconductor light emitting device according to the embodiment.

Next, as shown in FIG. 7B, an aluminum film 41 and a pad electrode 42 of the n-side electrode 40 are sequentially formed on the second surface 15b. The n-side electrode 40 is formed by e.g. the evaporation method. As shown in FIG. 12, the n-side electrode 40 may override the insulating film 61 on the second surface 15b.

Figure 7C:
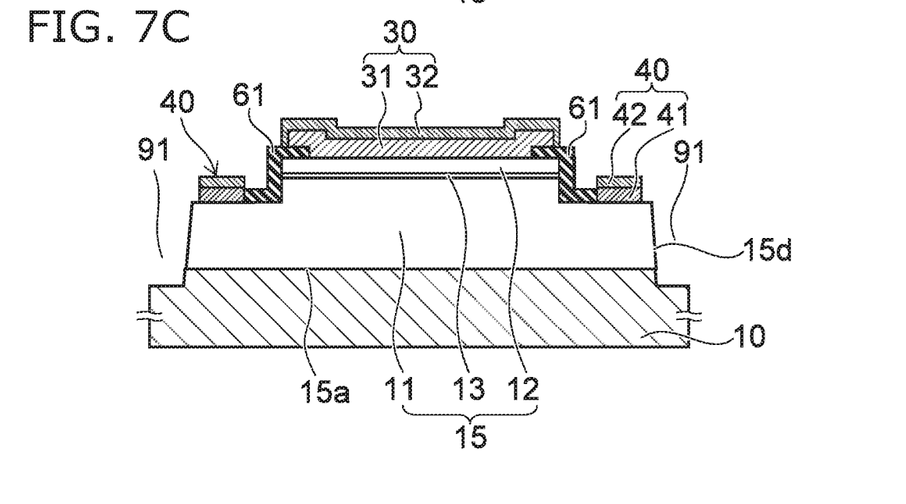

Next, as shown in FIG. 7C, a groove 91 is formed in the semiconductor layer 15 by e.g. the RIE method. The groove 91 penetrates through the portion of the first semiconductor layer 11 on which the light emitting layer 13 and the second semiconductor layer 12 are not stacked. The groove 91 reaches the substrate 10. The groove 91 is formed like e.g. a lattice. A plurality of semiconductor layers 15 are separated by the groove 91 on the substrate 10.

At the time of RIE for forming the groove 91, overetching slightly proceeds on the substrate 10. Thus, the bottom of the groove 91 is set back from the first surface 15a.

Figure 8A:
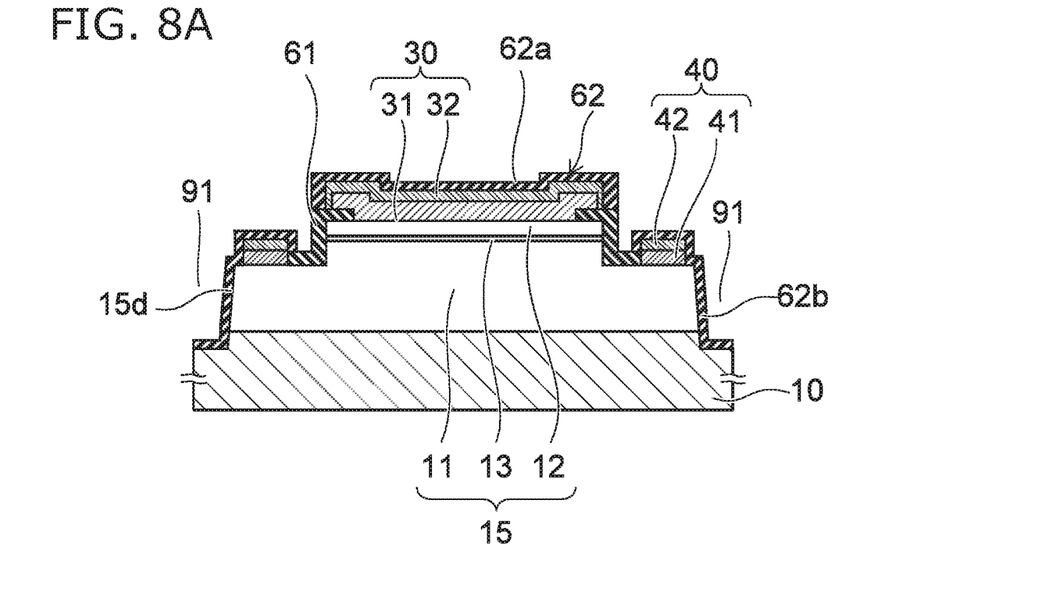
FIGS. 8A and 8B are schematic sectional views showing a method for manufacturing the semiconductor light emitting device according to the embodiment.

As shown in FIG. 8A, the p-side electrode 30 and the n-side electrode 40 are covered with an insulating film 62. The insulating film 62 is formed also on the side surface and the bottom of the groove 91. The side surface 15d of the semiconductor layer 15 is covered with the insulating film 62. The insulating film 62 is formed from e.g. silicon oxide film by the CVD method.

Subsequently, an opening for connecting to the via 25a shown in FIG. 2 and an opening for connecting to the via 22a shown in FIG. 3B are formed in the insulating film 62 by e.g. the wet etching method. At the time of this wet etching, part of the insulating film 62 formed at the bottom of the groove 91 is also removed.

Figure 8B:
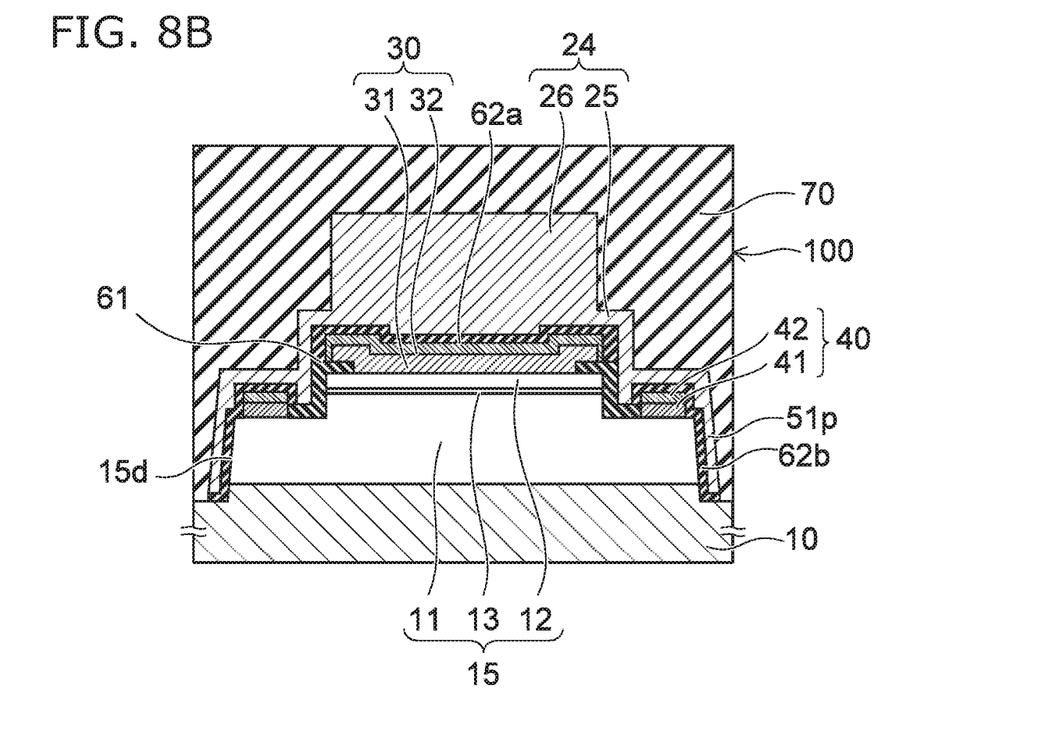

Subsequently, as shown in FIG. 8B, metal films constituting interconnect parts 24, 21 and metal films 51p, 51n are formed by the plating method. Furthermore, a resin layer 70 covering the metal films is formed.

Then, the substrate 10 is removed in the state in which the semiconductor layer 15 is supported by the support body 100 including the interconnect parts 24, 21 and the resin layer 70.

For instance, the substrate 10 as a silicon substrate is removed by wet etching or dry etching. Alternatively, in the case where the substrate 10 is a sapphire substrate, it can be removed by the laser lift-off method.

The semiconductor layer 15 epitaxially grown on the substrate 10 may contain a large internal stress. The p-side metal pillar 26, the n-side metal pillar 23, and the resin layer 70 are made of materials softer than the semiconductor layer 15 made of e.g. a GaN-based material. Thus, even if the internal stress during epitaxial growth is released in one stroke at the time of stripping, the p-side metal pillar 26, the n-side metal pillar 23, and the resin layer 70 absorb the stress. This can avoid damage to the semiconductor layer 15 in the process for removing the substrate 10.

Figure 9A:
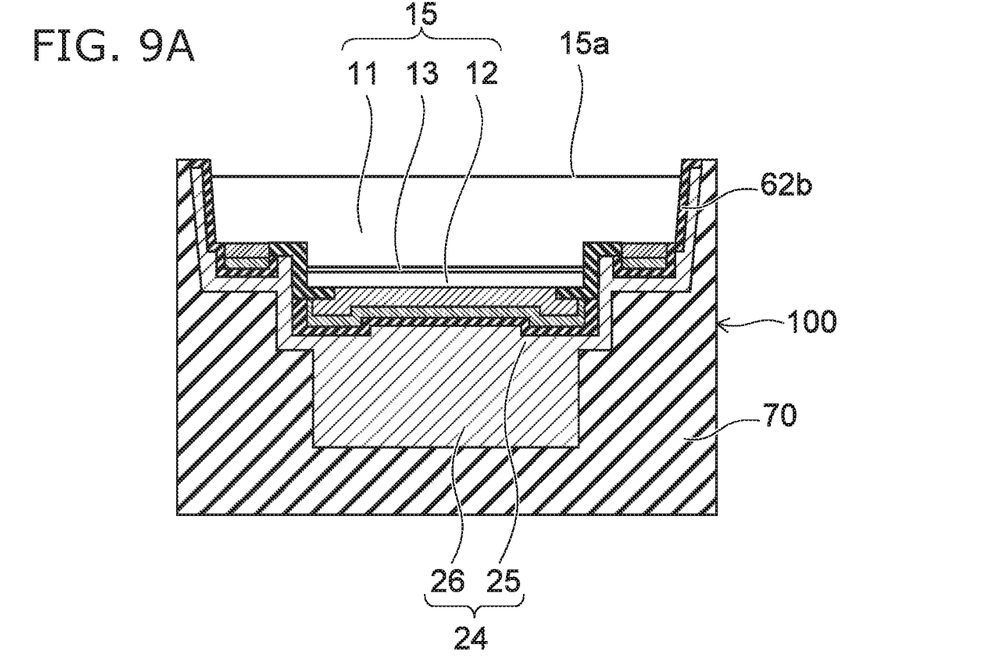
FIGS. 9A and 9B are schematic sectional views showing a method for manufacturing the semiconductor light emitting device according to the embodiment.

After the substrate 10 is removed, the first surface 15a of the semiconductor layer 15 is exposed as shown in FIG. 9A. The upper surface of the insulating film 62b provided on the lateral side of the semiconductor layer 15 and the upper surface of the resin layer 70 are located at the bottom of the groove 91 described above. The first surface 15a is set back downward from the upper surface of the insulating film 62b and the upper surface of the resin layer 70.

Figure 9B:
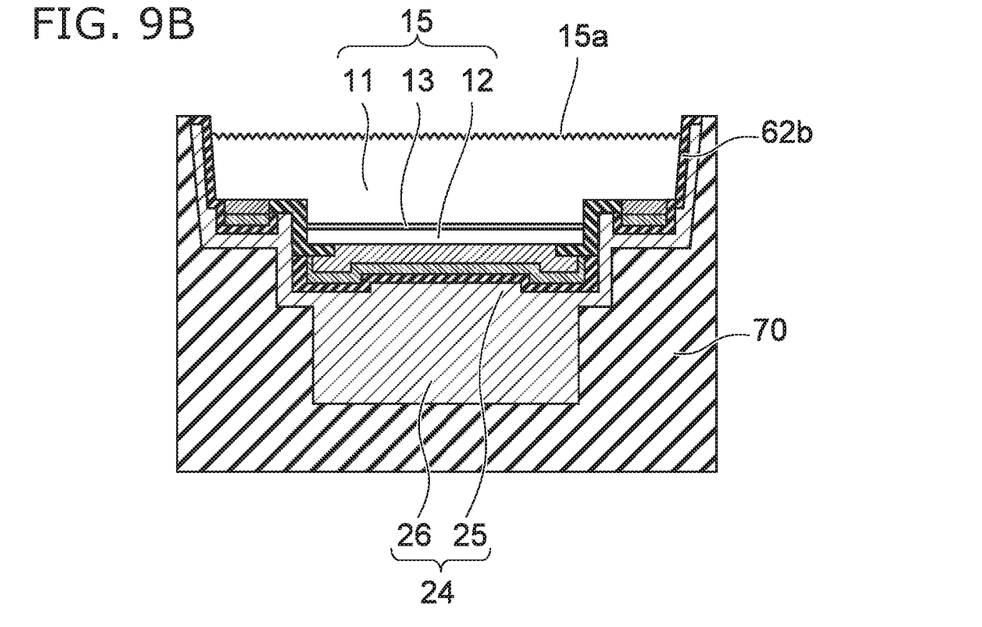
Figure 10:
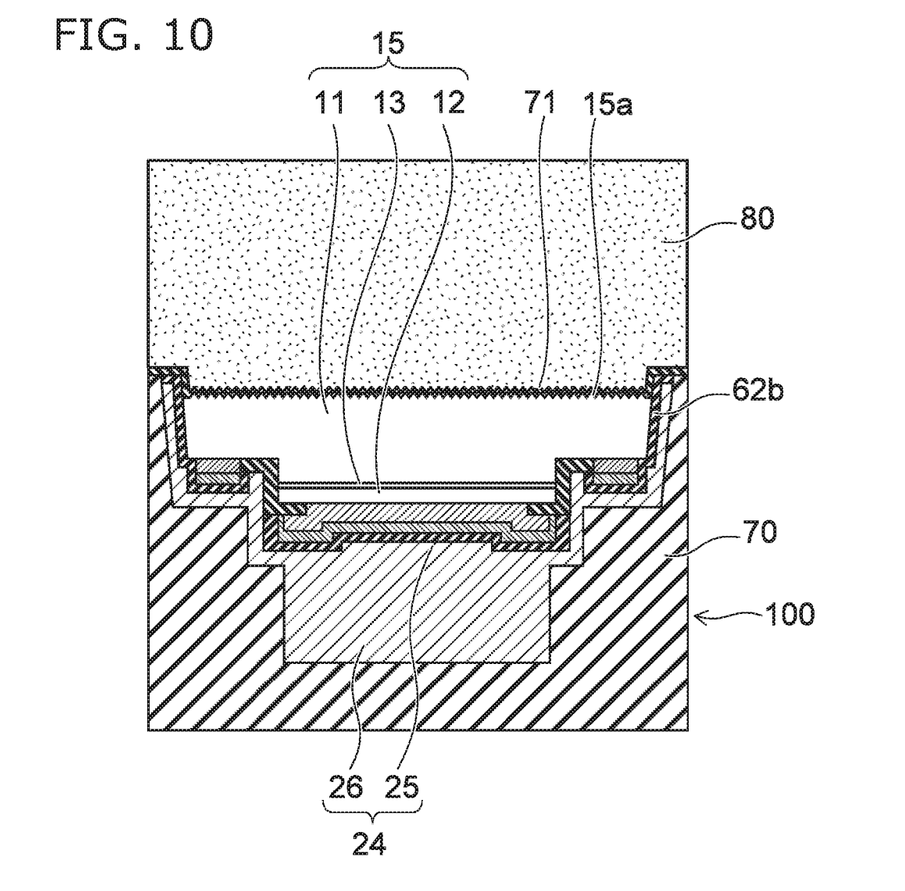
FIG. 10 is a schematic sectional view showing a method for manufacturing the semiconductor light emitting device according to the embodiment.

As shown in FIG. 9B, fine asperities are formed at the exposed first surface 15a. Subsequently, as shown in FIG. 10, a phosphor layer 80 is formed via an insulating film (adhesion layer) 71 on the first surface 15a. The phosphor layer 80 is formed also on the region on the lateral side of the semiconductor layer 15 via the insulating film 71.

After the phosphor layer 80 is formed, the surface of the resin layer 70 (the lower surface in FIG. 10) is ground. Thus, the p-side metal pillar 26 and the n-side metal pillar 23 are exposed from the resin layer 70.

Then, the wafer is diced in the region where the aforementioned groove 91 is formed. The phosphor layer 80, the insulating film 71, and the resin layer 70 are cut. These are cut by e.g. a dicing blade or laser light.

The wafer is singulated as a semiconductor light emitting device including at least one semiconductor layer 15. The semiconductor light emitting device may have a single-chip structure including one semiconductor layer 15, or a multi-chip structure including a plurality of semiconductor layers 15.

The aforementioned steps before singulation are performed collectively in the wafer state. Thus, formation of interconnect layers, formation of pillars, packaging with the resin layer, and formation of the phosphor layer do not need to be performed for each singulated device. This can significantly reduce the cost.

The support body 100 and the resin layer 70 are cut after they are formed in the wafer state. Thus, the side surface of the phosphor layer 80 is aligned with the side surface of the support body 100 (the side surface of the resin layer 70). These side surfaces form the side surface of the singulated semiconductor light emitting device. Accordingly, in addition to the absence of the substrate 10, the embodiment can provide a small semiconductor light emitting device of the chip-size package structure.

The silver film 31 having a high reflectance is preferably spread to the end of the third surface 15c. The silver film 31 is formed on the entire surface of the third surface 15c. To this end, the end of the opening 61a may be matched with the end of the third surface 15c in the process for forming the opening 61a in the insulating film 61 shown in FIG. 6A. However, this process control may be difficult. If the opening 61a is spread to the second surface 15b side due to process variation, there is concern about short circuit between the p-side electrode 30 and the first semiconductor layer 11 and short circuit between the p-side electrode 30 and the n-side electrode 40.

Thus, according to the embodiment, part of the insulating film 61 is left near the edge of the third surface 15c to suppress the expansion of the opening 61a. Furthermore, the silver film 31 is formed so as to override the insulating film 61. This achieves expansion of the area of the silver film 31.

Figure 11A:
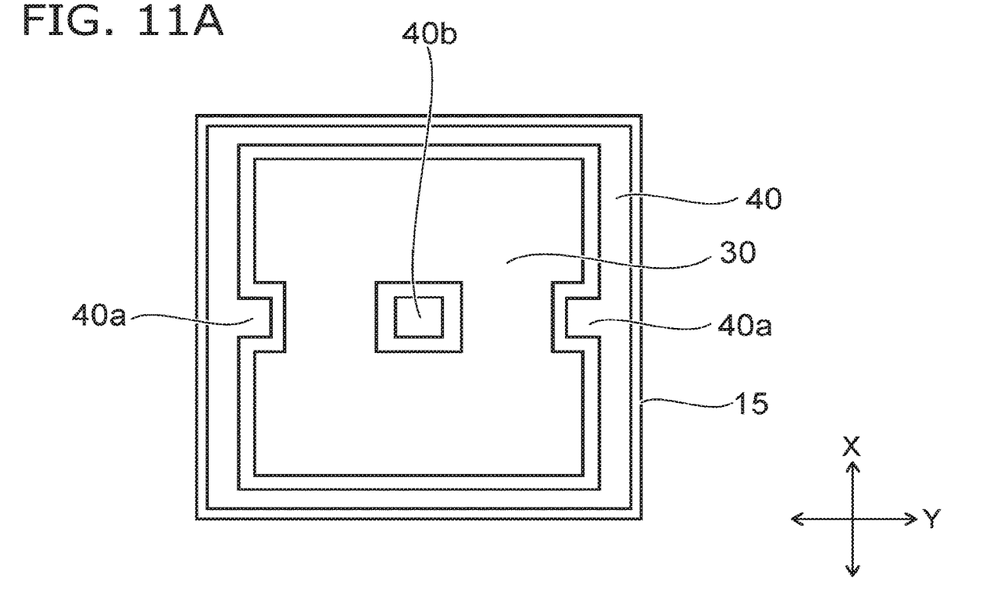
FIGS. 11A and 11B are schematic plan views of some components of the semiconductor light emitting device according to the embodiment.

FIG. 11A is a schematic plan view showing an alternative example of the planar layout of the p-side electrode 30 and the n-side electrode 40.

Figure 11B:
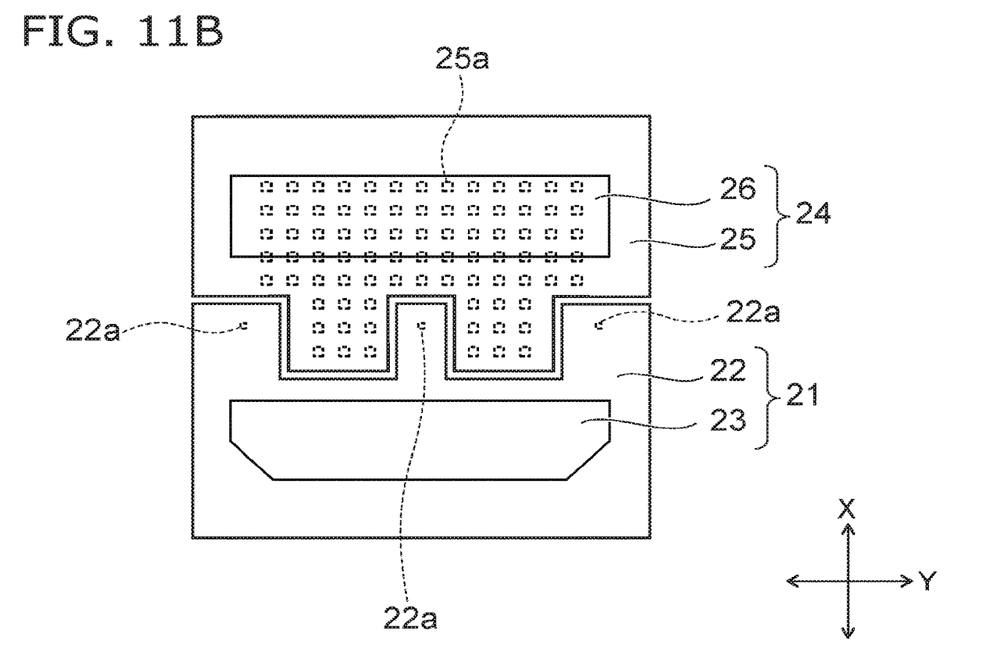

FIG. 11B is a schematic plan view showing a planar layout example of the p-side interconnect part 24 and the n-side interconnect part 21 in the electrode layout of FIG. 11A.

In the example shown in FIGS. 11A and 11B, the planar shape of the semiconductor light emitting device is a square. The n-side electrode 40 continuously surrounds the periphery of the p-side electrode 30. Two opposed side parts of the n-side electrode 40 are provided with contact parts 40a protruding to the p-side electrode 30 side. Furthermore, the chip central part is also provided with a contact part 40b of the n-side electrode 40. The p-side electrode 30 continuously surrounds the periphery of the contact part 40b.

In the p-side electrode 30 shown in FIG. 11A, the end part near the n-side contact part 40b at the center of the chip can also be configured to have a structure opposed to the third surface 15c via the insulating film 61 as in the above embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A semiconductor light emitting device comprising:
a semiconductor layer having a first surface, a second surface provided on opposite side from the first surface, and a third surface provided on the opposite side from the first surface with a step difference with respect to the second surface, the semiconductor layer including a light emitting layer between the first surface and the third surface;
a first electrode in contact with the second surface;
a second electrode provided in a plane of the third surface, including a contact part in contact with the third surface and an end part not in contact with the third surface, the second electrode containing silver;
an insulating film provided between the end part of the second electrode and the third surface;
a first interconnect part connected to the first electrode; and
a second interconnect part connected to the second electrode,
a contact area of the insulating film and the third surface being smaller than a contact area of the contact part of the second electrode and the third surface.

2. The device according to claim 1, wherein the second electrode is not provided on a side surface between the second surface and the third surface of the semiconductor layer.

3. The device according to claim 1, wherein
the second electrode includes a silver film in contact with the third surface, and
an end part of the silver film is opposed to the third surface with the insulating film interposed.

4. The device according to claim 3, wherein the second electrode further includes a pad electrode covering the silver film.

5. The device according to claim 1, wherein the first electrode includes an aluminum film in contact with the second surface.

6. The device according to claim 1, further comprising a metal film opposed to the semiconductor layer between the first electrode and the second electrode.

7. The device according to claim 6, wherein the metal film includes an aluminum film.

8. The device according to claim 1, further comprising:
a metal film provided on a lateral side of the semiconductor layer.

9. The device according to claim 8, wherein the metal film includes an aluminum film.

10. The device according to claim 1, further comprising a phosphor layer provided on a first surface side.

* * * * *